United States Patent
Yoshida et al.

(10) Patent No.: US 7,528,413 B2
(45) Date of Patent: May 5, 2009

(54) SINTERED DIAMOND HAVING HIGH THERMAL CONDUCTIVITY AND METHOD FOR PRODUCING THE SAME AND HEAT SINK EMPLOYING IT

(75) Inventors: Katsuhito Yoshida, Hyogo (JP); Hideaki Morigami, Hyogo (JP); Takahiro Awaji, Hyogo (JP); Tetsuo Nakai, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 729 days.

(21) Appl. No.: 10/494,947

(22) PCT Filed: Oct. 16, 2002

(86) PCT No.: PCT/JP02/10747

§ 371 (c)(1),
(2), (4) Date: May 7, 2004

(87) PCT Pub. No.: WO03/040420

PCT Pub. Date: May 15, 2003

(65) Prior Publication Data

US 2005/0051891 A1  Mar. 10, 2005

(30) Foreign Application Priority Data

Nov. 9, 2001 (JP) ............................. 2001-344952
Feb. 7, 2002 (JP) ............................. 2002-030592
Mar. 7, 2002 (JP) ............................. 2002-062294
Mar. 19, 2002 (JP) ............................. 2002-075283

(51) Int. Cl.
*H01L 29/15* (2006.01)
*H01L 31/0312* (2006.01)

(52) U.S. Cl. .................. 257/77; 257/712; 257/713; 257/720; 428/408; 428/539.5; 428/402; 428/332; 438/117; 438/929

(58) Field of Classification Search .............. 257/77, 257/439, 468, 625, 675, 705–722; 264/25, 264/81; 175/434, 420.2; 438/117, 929; 428/402, 428/408, 332, 539.5

See application file for complete search history.

(56) References Cited

U.S. PATENT DOCUMENTS 3,754,905 A * 8/1973 Knopp ................ 428/539.5

(Continued)

FOREIGN PATENT DOCUMENTS

DE  2705824  6/1981

(Continued)

OTHER PUBLICATIONS

Japanese Office Action, with English translation, issued in Japanese Patent Application No. JP 2003-542664, mailed Dec. 18, 2007.

*Primary Examiner*—Zandra Smith
*Assistant Examiner*—Telly D Green
(74) *Attorney, Agent, or Firm*—McDermott Will & Emery LLP (57) ABSTRACT

This invention relates to a high thermal conductivity composite material which comprises diamond particles and a copper matrix useful as electronic heat sinks for electronics parts, particularly for semiconductor lasers, high performance MPUs (micro-processing units), etc., also to a process for the production of the same and a heat sink using the same. According to the high thermal conductivity diamond sintered compact of the present invention, in particular, there can be provided a heat sink having a high thermal conductivity as well as matching of thermal expansions, most suitable for mounting a large sized and high thermal load semiconductor chip, for example, high output semiconductor lasers, high performance MPU, etc. Furthermore, the properties such as thermal conductivity and thermal expansion can freely be controlled, so it is possible to select the most suitable heat sink depending upon the features and designs of elements to be mounted.

19 Claims, 6 Drawing Sheets

U.S. PATENT DOCUMENTS

| | | | |
|---|---|---|---|
| 4,104,344 A * | 8/1978 | Pope et al. ..................... 264/42 |
| 4,234,168 A * | 11/1980 | Kajinaga et al. ............. 266/128 |
| 5,008,737 A | 4/1991 | Burnham et al. |
| 5,045,972 A | 9/1991 | Supan et al. |
| 5,130,771 A | 7/1992 | Burnham et al. |
| 5,197,651 A * | 3/1993 | Nakamura et al. ......... 228/44.7 |
| 5,294,381 A * | 3/1994 | Iguchi et al. ................. 264/400 |
| 5,536,485 A * | 7/1996 | Kume et al. ................. 423/446 |
| 5,874,175 A * | 2/1999 | Li ............................... 428/457 |
| 5,976,909 A * | 11/1999 | Shiomi et al. ............... 438/105 |
| 6,261,329 B1 * | 7/2001 | Ogata et al. ................... 51/309 |
| 6,302,225 B1 * | 10/2001 | Yoshida et al. .............. 175/434 |
| 6,342,301 B1 * | 1/2002 | Yoshida et al. .............. 428/408 |
| 6,361,857 B1 * | 3/2002 | Saito et al. ............... 428/319.1 |
| 6,413,589 B1 * | 7/2002 | Li ........................... 427/376.6 |
| 6,592,436 B1 * | 7/2003 | Abe et al. ...................... 451/64 |
| 6,753,093 B2 * | 6/2004 | Tanaka et al. ............... 428/615 |
| 2002/0047058 A1 * | 4/2002 | Verhoff et al. ................. 241/26 |
| 2003/0044613 A1 * | 3/2003 | Cho et al. ................... 428/408 |
| 2004/0062928 A1 * | 4/2004 | Raghavan et al. ........... 428/408 |

FOREIGN PATENT DOCUMENTS

| | | |
|---|---|---|
| EP | 364155 | 4/1990 |
| EP | 475575 | 3/1992 |
| EP | 475575 A1 * | 3/1992 |
| EP | 859408 | 8/1998 |
| EP | 898310 A2 | 2/1999 |
| JP | 52-134890 | 11/1977 |
| JP | 55-8447 | 3/1980 |
| JP | 56-14634 | 4/1981 |
| JP | 02-170452 | 7/1990 |
| JP | 04-259305 | 9/1992 |
| JP | 9-209058 | 8/1997 |
| JP | 09-312362 | 12/1997 |
| JP | 10-223812 | 8/1998 |
| JP | 11-67991 | 3/1999 |
| JP | 2000-303126 | 10/2000 |

* cited by examiner

SINTERED DIAMOND HAVING HIGH THERMAL CONDUCTIVITY AND METHOD FOR PRODUCING THE SAME AND HEAT SINK EMPLOYING IT

FIELD OF THE INVENTION

This invention relates to a high thermal conductivity composite material which comprises diamond particles and a copper matrix useful as electronic heat sinks for electronics parts, particularly for semiconductor lasers, high performance MPUs (micro-processing units), etc., also to a process for the production of the same and a heat sink using the same.

BACKGROUND OF THE INVENTION

Thermal management is a critical issue in electronic parts such as the semiconductor lasers for optical communications and a high performance MPU. In most cases efficient removal of the heat generated by the semiconductor component is achieved by directly bonding a semiconductor component on a heat sink with a solder.

In the prior art an aluminum nitride (AlN) compact or a silicon carbide (SiC) compact has been the widely used material for the heat sinks above mentioned. In recent years, however, the thermal conductivities of these materials (250 W/mK for AlN and 270 W/mK for SiC) are getting insufficient to remove the generated heat from the electronic components because the more heat is being generated by the electronic parts as the output power of semiconductor lasers or the integration level of ICs is getting higher.

As for the thermal conductivity, diamond and cubic boron nitride (cBN) are the promising candidates as high performance heat sink materials. Heat sinks made of diamond or cBN are practically used for laser diodes for fiber-optic networks, which require extremely high reliability. This has been realized because the manufacturing technology of diamond has been so much improved either with CVD method or with high pressure and high temperature method that diamond has become commercially available. CBN compact which is made under high pressure and high temperature is also commercially available. cBN can also be produced by converting hBN (hexagonal boron nitride) being an allotrope of cBN at an ultra-high pressure and high temperature, followed by converting and sintering.

On the other hand, due to the progress in the optical communication technology, higher output power of semiconductor lasers is required. To meet this requirement, the semiconductor laser chips get larger in sizes and thus the thermal stress caused by the mismatch of the coefficient of thermal expansion (hereinafter referred to as CTE) between the semiconductor chips and the heat sinks gets a serious problem. More specifically, as the CTE of diamond is about $2.3 \times 10^{-6}$/K and is much smaller than that of GaAs ($5.9 \times 10^{-6}$/K) or of InP ($4.5 \times 10^{-6}$/K), the reliability of the diode lasers is limited by the operation cycles as well as the soldering process.

To solve the above mentioned problems both an efficient cooling and a reduced mismatch of the CTE with semiconductor are required for a heat sink material. In other words, a material having both high thermal conductivity and reduced CTE mismatch with Si, GaAs, or InP is demanded.

Thus, the prior art discloses the use of a metal-diamond composite which has a relatively high thermal conductivity and also has a CTE which is substantially identical with that of semiconductor materials, as shown for example in JP-A-2-170452 (corresponding to U.S. Pat. Nos. 5,008,737 and 5,130,771), JP-A-4-259305 (corresponding to U.S. Pat. No. 5,045,972), JP-A-10-223812 and JP-A-11-067991.

JP-A-2-170452 discloses a composite material which is comprised of a metal matrix in which diamond particles have been thoroughly mixed and embedded wherein the proportions of diamond particles and metals are selected to form a composite having a CTE which is substantially the same as that of said semiconductor. The metal matrix of which is composed of at least one metal selected from the group consisting of copper, silver, gold and aluminum. Unfortunately, this composite material has some problems. One is the insufficient thermal conductivity because of the remaining voids within the composite caused by the poor wettability and reactivity between diamond and metals such as copper, silver, gold and aluminum. In addition to that because of the poor reactivity between diamond and the said metals, the surface roughness of the finished products is not smooth enough due to the removal of diamond particles from the surface during surface polishing process. The poor surface roughness of the heat sink makes the thermal contact between the semiconductor chip and the heat sink weak and thus the heat sink can not remove the heat efficiently enough.

JP-A-4-259305 discloses a composite material consisting of a metal matrix selected from the group consisting of aluminum, magnesium, copper, silver and alloys thereof and diamond particles. The disclosed production method of the composite material is as follows; (1) typical powder metallurgy techniques which include consolidation of the composite powder mixture by vacuum hot pressing, casting and explosive consolidation, (2) compaction of diamond powder and infiltrating the voids of the resulting compact with molten metal under pressure. Typical powder metallurgy techniques, however, have the same problems as those of JP-A-2-170452. With the simple method of compaction under high pressure and high temperature, which is used for making diamond compacts for cutting tools, diamond and copper cannot be sintered due to the influences of oxygen or nitrogen in the air.

JP-A-10-223812 and JP-A-11-067991 disclose the metal-diamond composite in which metal carbide is formed on the surface of diamond so as to improve the wettability between diamond and the above described metal and then the bonding strength at the interface between diamond and the metal is improved resulting in the improved properties of the composite. According to this method, however, the metal carbide at the interface degrades the thermal conductivity and a material of higher thermal conductivity cannot be obtained when compared with a material consisting of only diamond and copper.

In the above described technique as methods for the production of metal-diamond composites, methods comprising a sintering of mixed powder of diamond and metal under vacuum, hot press sintering, ultra high pressure sintering, etc. have been disclosed. Above all, ultra-high pressure and high temperature sintering method is most suitable for obtaining a substantially void free composite, at which the present invention aims. The ultra-high pressure and high temperature sintering method has been employed as a method of producing a sintered compact for a cutting tool material comprising diamond as a primary constituent and a ferrous metal such as cobalt as the binder. The ferrous metal works as a solvent of carbon and precipitate the carbon as diamond under ultra-high pressure and high temperature. Accordingly, the diamond particles bond strongly with each other resulting in that the CTE of the sintered compact is no higher than that of diamond. Moreover, the thermal conductivity of the compact is at most 400 W/mK by the adverse effect of the binder metal whose thermal conductivity is rather low.

Figure 1:
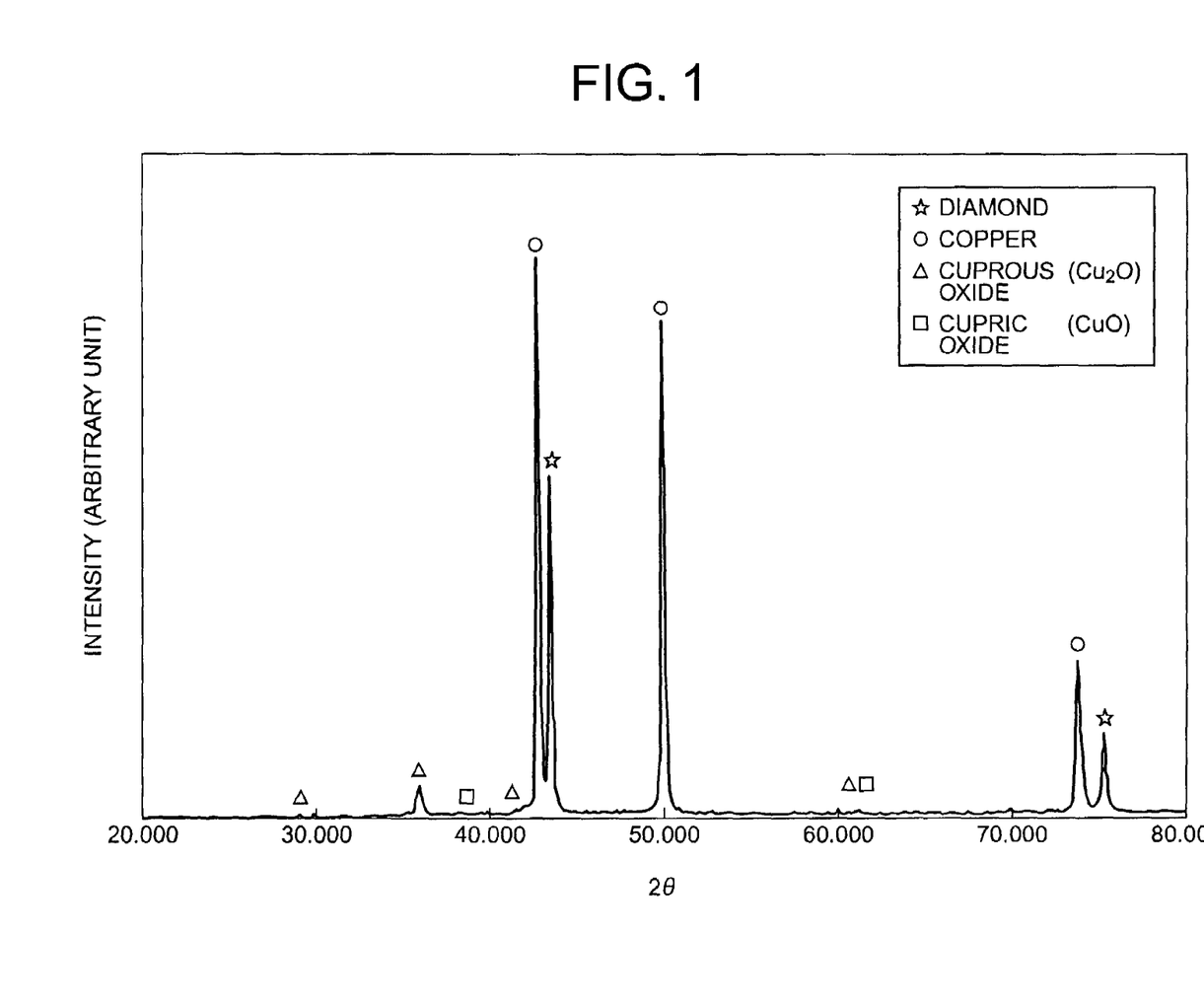
FIG. 1 is an X-ray diffraction (CuKα radiation) pattern of a sintered composite prepared by the prior art.

JP-B-55-008447 and JP-B-56-014634 disclose the method of producing a diamond sintered compact whose binder is copper. The art disclosed by these patents is supplying melted copper or copper alloy through an orifice of a capsule filled with diamond powder placed in contact with the copper or copper alloy. The object of that invention is to provide a non-magnetic diamond compact by replacing a part of the binder metal with copper. By this method, however, one cannot obtain a diamond compact having thermal conductivity as high as 500 W/mK due to the small amount of oxidization of copper during the sintering process in which the capsule is partly broken under pressure and some leak of air occurs. Therefore, small amount of $Cu_2O$ and $CuO$ exist in the sintered compact, as is shown in FIG. 1, the X-ray diffraction pattern of the sintered compact.

As above described, in the prior art, there have been no high performance heat sink materials suitable for high power semiconductor laser diodes or high performance MPUs due to the large mismatches of CTE between the conventional high thermal conductivity heat sink materials and semiconductor materials or due to the surface roughness of the polished surface. The principal object of the present invention is to provide a material whose thermal conductivity is higher than those of AlN or SiC (i.e. >500 W/mK) as well as whose CTE is close to those of the semiconductor chips made of InP or GaAs, i.e. $3.0$-$6.5 \times 10^{-6}$/K.

DISCLOSURE OF THE INVENTION

We, the inventors have found that a diamond compact having a high thermal conductivity, i.e. at least 500 W/mK and at the same time, CTE of 3.0 to $6.5 \times 10^{-6}$/K can be obtained by sintering diamond, which has the thermal conductivity of 2000 W/mK and the highest thermal conductivity of all materials, using copper as a binding material according to the method disclosed in the present invention.

The present invention has been accomplished based on the finding and the gist of the present invention consists in a sintered diamond compact of high thermal conductivity comprising of 60 vol % to 90 vol %, on the whole compact basis, of diamond, which is substantially free from pores inside and has a grain size distribution peak in a range of from 5 μm to 100 μm, and the balance of substantially copper, at least two grains being directly bonded with each other, the copper forming the foregoing sintered compact being not subject to substantial oxidation, and the quantity of oxygen in the sintered compact is at most 0.025 weight %. Herein the diamond sintered compact substantially free from pores inside means a sintered compact of porosity not over 0.5%, which can be realized by being sintered under pressure of at least 1 GPa, as described hereafter. The above described sintered compact preferably has a thermal conductivity of 500 W/mK to 1500 W/mK.

Thus, by applying the diamond compact of the present invention to a heat sink material, a high performance heat sink with at least one side of at least 3 mm for mounting a semiconductor chip, which has been hard to realize due to the mismatch of CTEs between the semiconductor chip and the heat sink, can be provided. This heat sink, in particular, has remarkable advantages of the improvement of the performance of the semiconductor chips or the extension of the semiconductor life when at least one side of the semiconductor chip is at least 1 mm. That is, the merits of the present invention are particularly remarkable when the size of the heat sink is at least 3 mm square.

Figure 6:
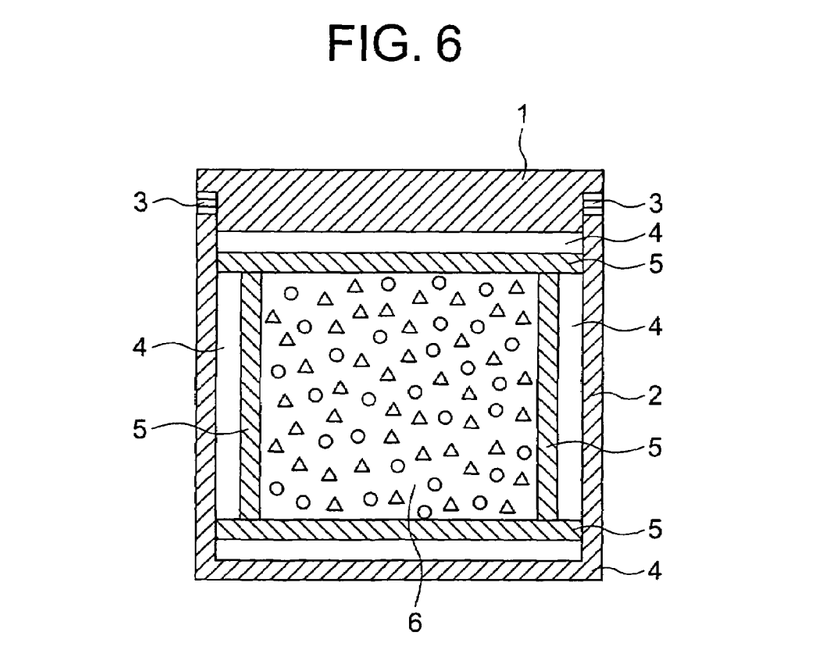
FIG. 6 is a cross-sectional view of a capsule structure used in Example 1.

In the attached drawings, FIG. 6 shows a cross-sectional view of a capsule used in the following Example 1, showing a molybdenum container and a molybdenum lid filled with a compressed body of mixed powders of diamond and copper according to the present invention. The container and the lid are sealed with a solder. In the FIG. 6, 1 designates a molybdenum lid, 2 a molybdenum capsule, 3 a solder, 4 a titanium plate, 5 a niobium plate and 6 a compressed body of mixed powders.

Figure 7:
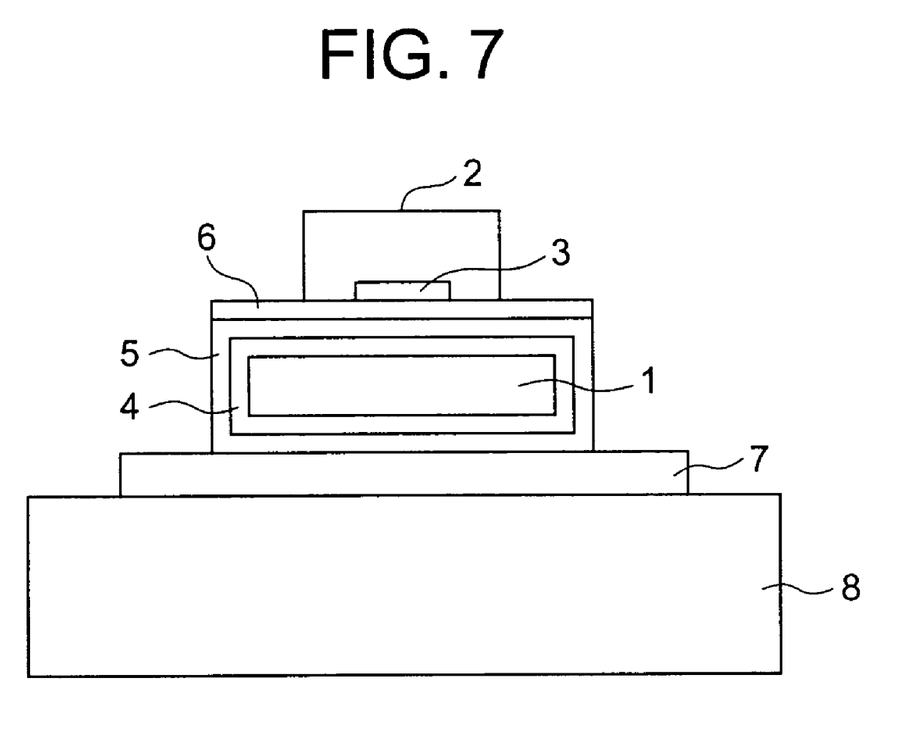
FIG. 7 is a schematic cross-sectional diagram of a heat sink prepared in Example 5 on which a semiconductor laser diode is mounted.

In FIG. 7, 1 designates a heat sink made of a sintered compact of a diamond and copper composite, 2 a semiconductor laser diode, 3 an active region of the semiconductor laser diode, 4 a first metallization layer (usually nickel), 5 a second metallization layer (usually platinum), 6 a third metallization layer (gold-tin alloy), 7 a solder and 8 a copper substrate.

BEST EMBODIMENT FOR PRACTISING THE INVENTION

Since high purity copper has a thermal conductivity of about 400 W/mK, it can be assumed that a material having a thermal conductivity of at least 400 W/mK is prepared by sintering diamond using copper as a binder. It is well known that the thermal conductivity of copper is lowered with impurities. Since copper does not form carbides and the molten copper has low wettability with diamond, no dense sintered compact can be obtained by merely mixing diamond and copper followed by raising the temperature above the melting point of copper. A diamond and copper sintered compact can be obtained if a compressed body of copper and diamond grains which are coated with a carbide forming material such as iron group metals, titanium, niobium, vanadium, etc., or silicon is sintered, but the thermal conductivity of the sintered compact is not high enough because the carbide layer gets the thermal barrier.

At an interface between a solid and liquid, the relationship of the surface energy can be expressed by the following equation;

$$\gamma_{LV} \cos\theta = \gamma_{SV} - \gamma_{SL}$$

($\gamma_{LV}$: liquid surface tension, $\gamma_{SV}$: solid surface tension, $\gamma_{SV}$: solid-liquid interface surface tension, θ: wetting angle)

Figure 2:
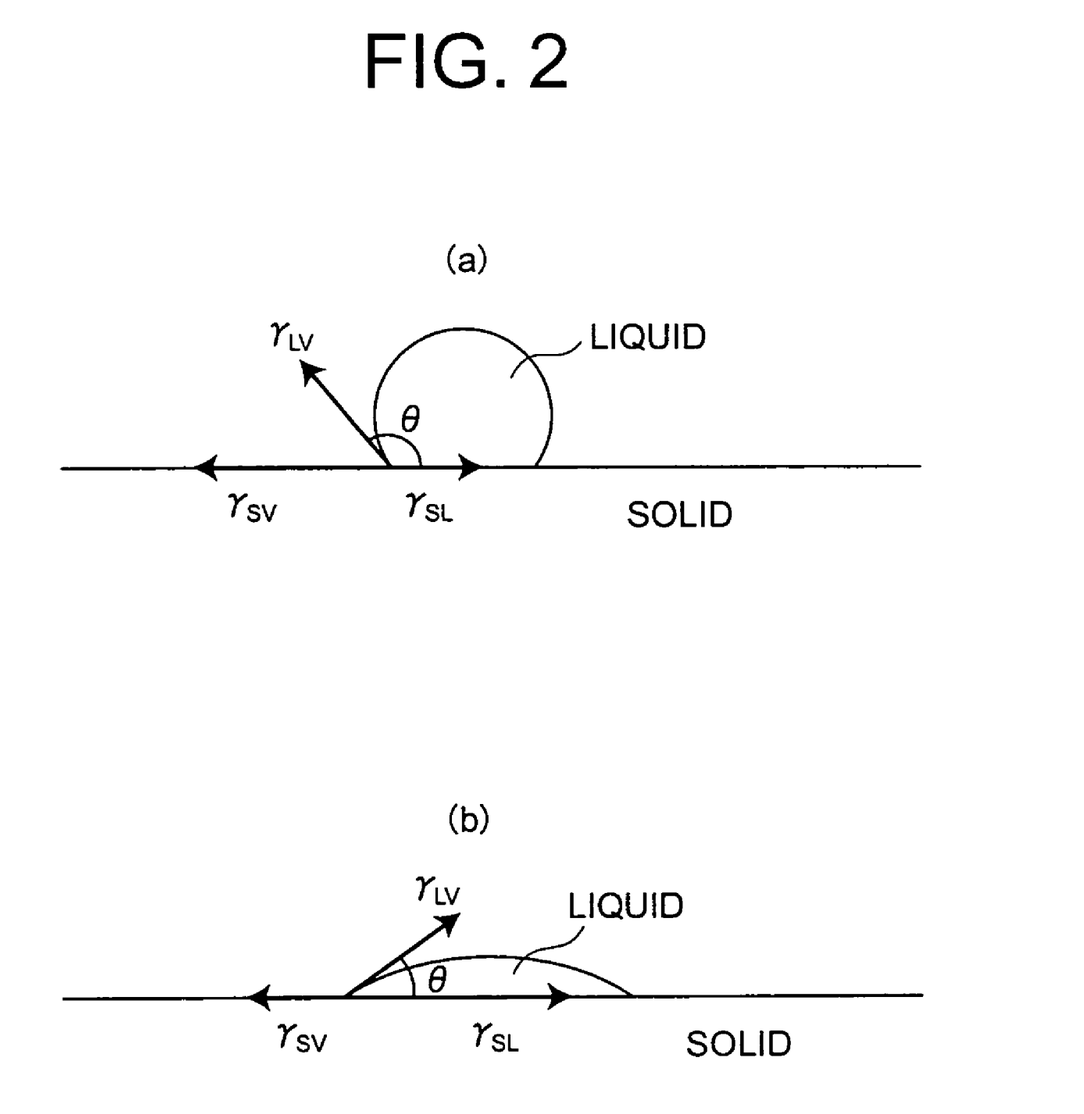
FIG. 2 is a schematic diagram of an interface between a solid and liquid to illustrate the concept of wettability thereof.

As the value of $\gamma_{LV} \cos\theta$ gets larger, the liquid is more wettable. FIGS. 2(a) and (b) illustrate this concept. Since liquid under high pressure may have a large surface energy, a liquid whose wettability is poor on a solid ($\gamma_{LV} \cos \theta$ is small) under atmospheric pressure gets more wettable under high pressure. This phenomenon applies to an interface between copper (liquid) and diamond. Under atmospheric pressure the wettability of copper liquid is so poor that the copper liquid cannot wet the whole surface of diamond particles and therefore sintering is not possible. However under high pressure the wettability is improved and the copper liquid can wet the whole surface of diamond particles. In order to prepare a substantially pore free sintered compact, an ultra high pressure of at least 1 GPa is necessary. When diamond is held at high temperature of at least 1000° C. and at a pressure of around 1 GPa for a long time, however, diamond is converted into graphite and accordingly, it is preferable to sinter under a condition in which diamond is thermodynamically stable region, if possible, using an apparatus capable of holding the pressure and temperature in such a region. As the sintering pressure, it is preferable to hold the pressure of at least 4 GPa and it is more preferable to sinter at the pressure from 4 GPa to 6 GPa using the industrially used high pressure and high temperature apparatus for sintering diamond compacts. It can be assumed that a substantially pore-free and adjacent diamond partly contacted and bonded sintered compact is obtained by sintering under such high pressure condition.

Figure 3:
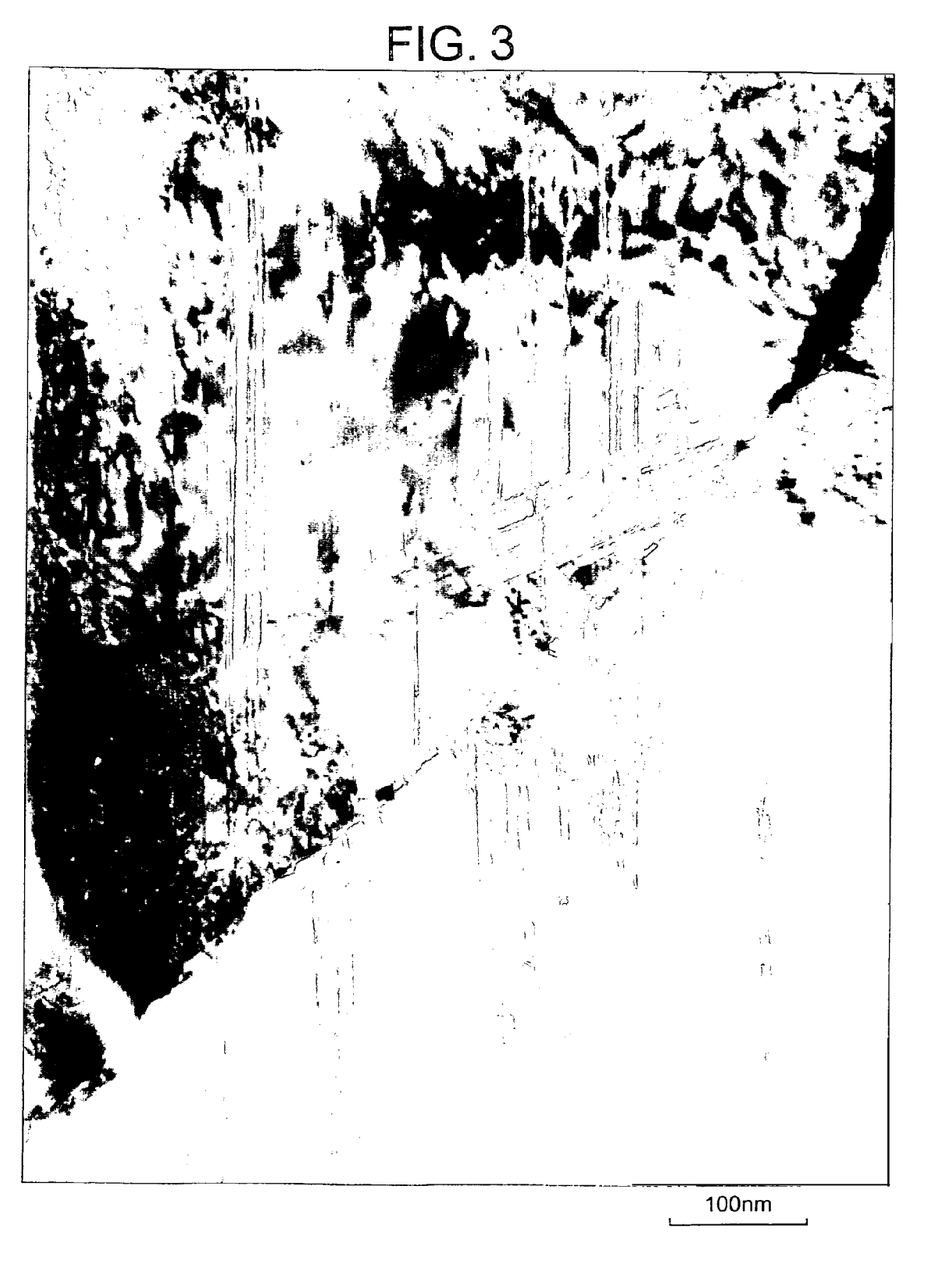
FIG. 3 is a TEM micrograph of the sintered compact prepared by the present invention method.

That is to say, since pores in the sintered compact have negative effect on its thermal conductivity, a sintered compact of high thermal conductivity can be obtained by completely removing the pores in the sintered compact. TEM observation of the compact sintered under this condition shows that the diamond particles bond each other (FIG. 3). Further, when the densities of sintered compacts have been measured, they are approximately in agreement with the theoretical values, varying from 4.05 g/cm$^3$ to 5.7 g/cm$^3$ depending on the proportion of diamond and copper in compacts. The preferable density of the sintered compact is 4.55 g/cm$^3$ to 5.15 g/cm$^3$ because the preferred volume proportion of diamond is in a range of 70 to 80%. The properties of the high thermal conductivity diamond sintered compact, as claimed in the following claims 4 to 6, are the preferred property ranges which the high thermal conductivity diamond sintered compacts claimed in any one of claims 1 to 3 have.

In addition, the present invention is based on the finding that the oxygen (copper oxide) in the sintered compact also has the negative effect on the thermal conductivity and that a high thermal conductivity can be realized only if the oxygen content of the compact is less than 0.025 weight %. In this case, for the purpose of adjusting the oxygen content less than 0.025 weight %, there are the following procedures:

(i) a metal whose oxidized energy is lower than copper is enclosed in a same capsule as that for the mixed powder body of copper and diamond (ii) the capsule is sealed in vacuum or inert gas A method for producing a high thermal conductivity diamond sintered compact according to the present invention is summarized below:

1. The process comprises a step of arranging a powder body of diamond grains having a grain size of 5 µm to 100 µm so as to be in contact with an oxygen free copper plate and sealing a metal capsule in which one or more sheets of metals selected from Group IVa and Va are inserted in contact with the copper plate in vacuum or in an inert gas or reducing gas, a step of processing the metal capsule at a pressure of 1 GPa to 6 GPa, preferably 4 GPa to 6 GPa, and at a temperature of 1100° C. to 1500° C., preferably 1100° C. to 1200° C., to infiltrate melted copper into the powder body of diamond grains and lowering the temperature to 900° C. or lower, while maintaining the pressure, to solidify the copper and a step of lowering the pressure and temperature to the atmospheric pressure and room temperature to obtain the pressed capsule, or 2. The process comprises a step of mixing a powder consisting of diamond grains having grain sizes of 5 µm to 100 µm with high purity copper powder of at least 3N, sealing a metal capsule in which the mixed powder are filled, in vacuum or in an inert gas or reducing gas, a step of processing the metal capsule at a pressure of 1 GPa to 6 GPa, preferably 4 GPa to 6 GPa, and at a temperature of 1100° C. to 1500° C., preferably 1100° C. to 1200° C. to melt the copper powder, and lowering the temperature to 900° C. or lower, while maintaining the pressure, to solidify the copper and a step of lowering the pressure and temperature to the atmospheric pressure and room temperature to obtain the pressed capsule.

As factors of affecting the thermal conductivity of the diamond/copper composite sintered compact manufactured under high pressure and high temperature condition as above mentioned, the volume ratio of diamond to copper, the purity of diamond grains, the amount of impurities of in the sintered compact, the size of diamond grains, etc. are listed.

Regarding the proportion of diamond to copper, as the volume ratio of diamond gets larger, the thermal conductivity gets higher, while the CTE of the composite gets smaller. Since the optimum CTE of the heat sink depends on the semiconductor material to be mounted, an optimum volume ratio of diamond and copper can be determined from the CTE within the ratio disclosed in the present invention. That is to say, the CTE of the sintered composite can be tailored by controlling the mixing ratio of the diamond powder and copper powder in the case of the mixing powder method and also can be tailored in the case of the infiltrating method by adjusting the distribution of the diamond grain size in such a tendency that the finer grain increases the copper content and the coarser grains decrease the copper content.

Higher purity of diamond grains is more preferable for the thermal conductivity, but because of the higher cost for getting high purity grains, commercially available diamond grains of the highest grade having a nitrogen content of 10 ppm to 200 ppm, preferably 50 ppm to 150 ppm should be used to get the desired thermal conductivity.

Higher purity of the diamond and copper making up the sintered compact is more preferable for the thermal conductivity of the sintered compact. It is required, therefore, that the capsule is sealed in vacuum or in an inert gas in order to make the purity of the sintered compact as high as possible. When this capsule is pressed under ultra-high pressure and high temperature by the prior art method, however, it is inevitable that a part of the capsule is broken and that the copper is oxidized, and that cuprous oxide ($Cu_2O$) and cupric oxide (CuO) exist, even though very small in amount, as is shown in the X-ray diffraction pattern of FIG. 1.

Figure 4:
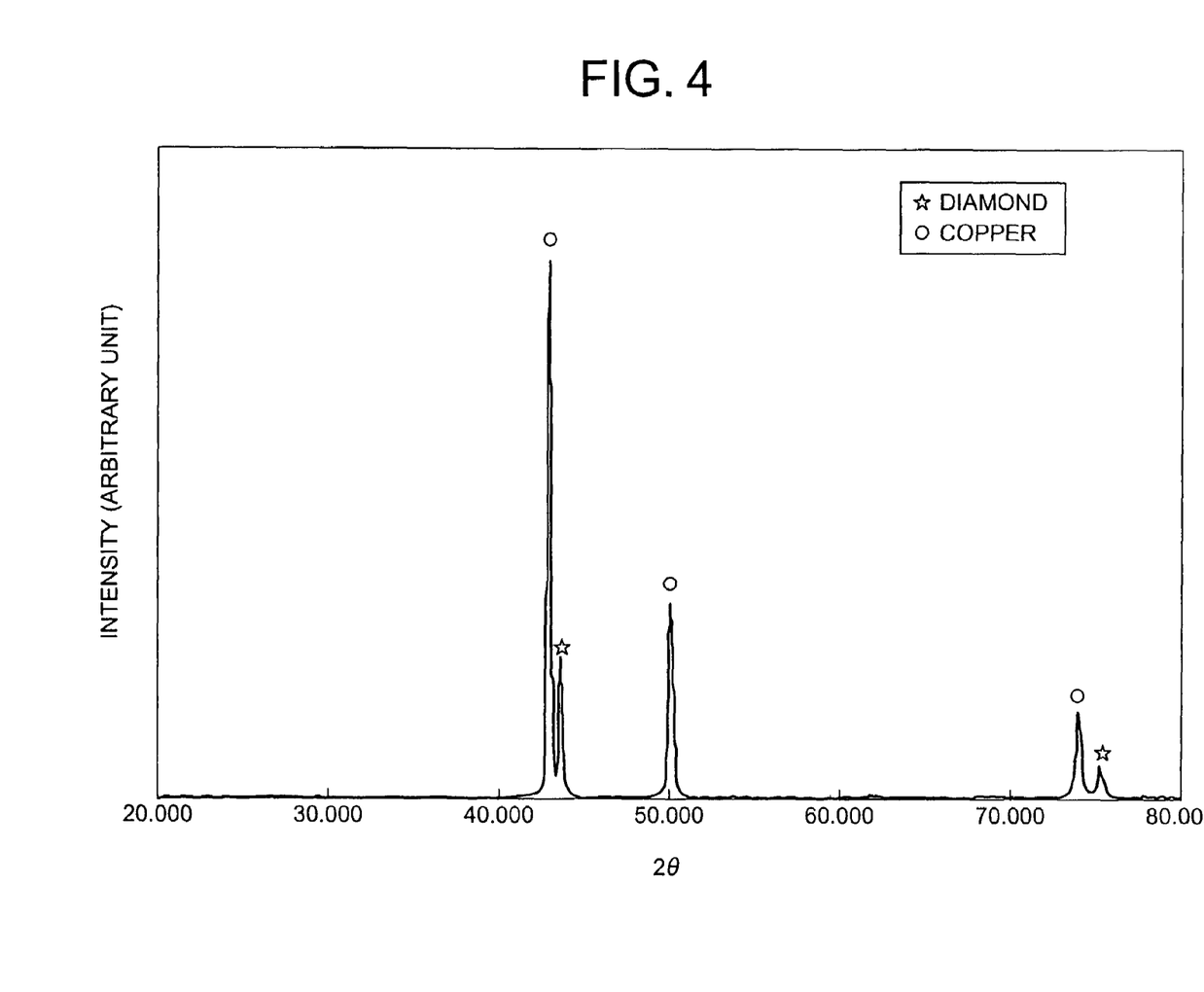
FIG. 4 is an X-ray diffraction (CuKα radiation) pattern of a sintered composite prepared by the present invention method.

By the method of the present invention, even if a part of the capsule is broken, Group IVa or Va metals of the periodic table, i.e. any one of titanium, vanadium, zirconium, niobium, hafnium and tantalum functions to prevent copper from being oxidized, because of the lower free energy of formation of oxides at high temperature compared with copper. When a sintered compact according to the method of the present invention is examined by an X-ray diffraction, no oxides are detected as is shown in FIG. 4 and only peaks of diamond and copper can be confirmed.

Regarding the size of diamond grains, in addition to the foregoing effect, the thermal barrier due to the grain boundary is reduced with the increase of the grain size of diamond grains, so that the thermal conductivity is increased. In the manufacturing process of heat sink products, however, in a step of cutting or polishing a sintered compact, there arise problems that large chip-out, or poor machinability, etc. if the diamond grain is too large in size. Accordingly, when the diamond grain size is within the range of 5 μm to 100 μm, preferably 10 μm to 80 μm, more preferably 20 μm to 50 μm, there arise no problems as mentioned before while maintaining the high thermal conductivity.

Figure 5:
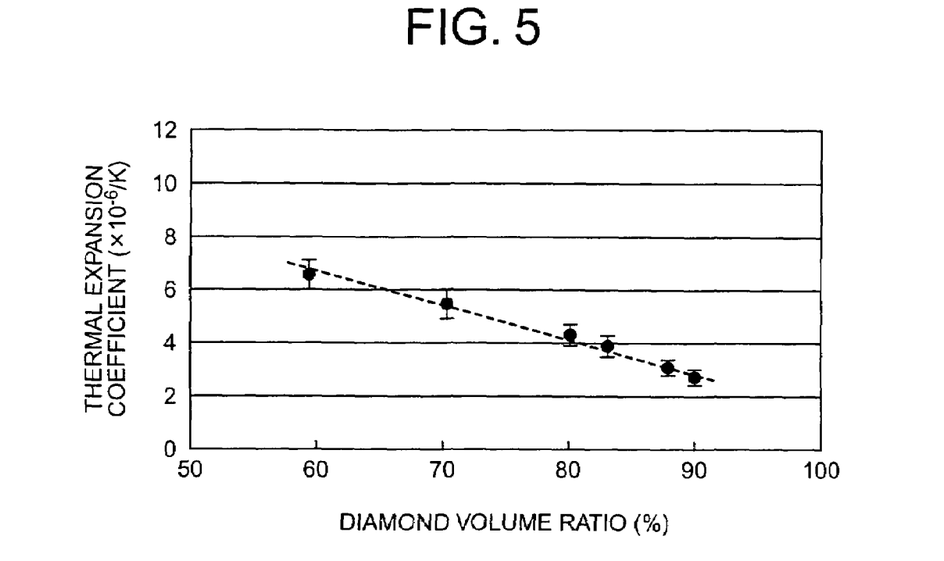
FIG. 5 is a graph showing the relationship between a volume ratio of diamond and the CTE of a sintered composite.

The CTE of this sintered compact is determined by the proportion of diamond and copper. It is obvious that the CTE of this sintered compact gets higher if the proportion of copper is increased in the sintered compact, since the CTE of copper, $16.79 \times 10^{-6}$/K is larger than that of diamond, $2.3 \times 10^{-6}$/K. The inventors discovered the relationship between the CTE of the composite and the volume proportion of diamond and copper as is shown by FIG. 5. From this relationship, it is apparent that the volume proportion of diamond for realizing the aimed CTE ranging from 3.0 to $6.5 \times 10^{-6}$/K, preferably 4.0 to $6.0 \times 10^{-6}$/K, close to those of semiconductor materials such as Si, InP, GaAs, etc., is 60% to 90%, preferably 70% to 80%. When using the sintered compact for heat sinks for semiconductor devices, in particular, this range (70% to 80%) is preferable. The proportion of diamond to copper can be controlled by the size of the diamond grains in the case of infiltrating method or by the mixing ratio of diamond and copper in the case of using copper powder as a starting material.

Another embodiment of the present invention is a heat sink for mounting a semiconductor chip. The heat sink is characterized in that at least one pair of two opposite faces are coated with at least one metal selected from nickel, chromium, titanium and tantalum or their alloys, and further one or more outer layer is coated with at least one metal selected from molybdenum, platinum, gold, silver, tin, lead, germanium and indium, or their alloys. It is preferable that the outermost coating layer of the heat sink is a metal of good solderability with semiconductor material. To this end, at least one metal of high affinity for diamond, a metal containing at least one element selected from the group of nickel, chromium, titanium and tantalum is coated onto the heat sink surface with the result that the coated layer has high adhesiveness to the heat sink. Furthermore, the surface of the heat sink contacting with semiconductor chip should be coated with at least one layer or multi-layer of at least one metal selected from the group of molybdenum, platinum, gold, silver, tin, lead, germanium and indium or their alloys which have good solderability so as to make a strong bonding between the semiconductor chip and the heat sink.

As for the other specification of the diamond heat sink for mounting a semiconductor chip according to the present invention, a heat sink which meets the following specification are most desired for the high performance as a heat sink;
(1) the surface on which a semiconductor chip is mounted is flatter than 30 μm/10 mm,
(2) the surface on which a semiconductor chip is mounted is smoother than Ra=0.5 μm,
(3) the chip out or the curvature radius of at least one edge of the surface on which a semiconductor chip is mounted is at most 30 μm.

When a surface on which a semiconductor chip is mounted has flatness inferior to 30 μm/10 mm, a gap or a thick brazing area arises between the semiconductor chip and heat sink, thus the thermal conductivity of the area is lowered. When the surface on which a semiconductor chip is mounted is rougher than 0.5 μm by Ra (an arithmetic mean roughness defined by JIS B 0601), as is the case with inferior flatness, a gap or a thick brazing area arises between the semiconductor chip and heat sink, thus the thermal conductivity of the area is deteriorated. If a semiconductor laser chip is mounted on a heat sink, in order to prevent an interference of a beam ejected from the end of an active layer thereof with the heat sink, the semiconductor chip is mounted in such a manner that the edge of the ejection side of the semiconductor chip is fitted with the edge of the heat sink. If there is a chip out or the curvature radius of at most 30 mm just below the active area, the heat generated at the active layer cannot be dissipated well enough.

As mentioned above, the ideal properties of a heat sink material for InP or GaAs semiconductor chips, i.e. thermal conductivity of higher than 500 W/mK and CTE of 3.0 to $6.5 \times 10^{-6}$/K, can be realized by the high thermal conductivity diamond sintered compact of optimized composition according to the present invention. It goes without saying that the sintered compact of the present invention can be used as a heat sink for conventional Si devices.

Furthermore, in order to prepare the heat sink for mounting a semiconductor utilizing the above described high thermal conductivity sintered compact, it is necessary to machine the sintered compact material into a required shape and size, then the shaped compact should be coated with metals to bond with semiconductor chip.

In the usual case, the sintered compact body is machined and polished to the required thickness and surface roughness followed by being cut into the required shape and size. After being cut, the shaped compact body is coated with metal layers and then used as a heat sink for mounting semiconductor chips.

In the process of coating a surface of the diamond-copper sintered compact with metal layers, the compact body is rinsed to remove the oxidized layer on the surface with weak acid and then being coated with metal layers with a method of electroplating, electroless plating, sputtering, ion plating and vapor depositing individually or in combination. The sintered compact can be cut with the use of the wire electric discharge machining or the laser cutting.

As a method of finishing the sintered compact body into the required thickness and surface roughness, either method of dry polishing using a polishing machine fitted with a resin bonded diamond wheel or wet grinding process using a surface grinder fitted with a resin bonded or vitrified bonded diamond grinding wheel.

In the case of surface finishing by the above described dry polishing method, it is desirable that the back side of the wheel is cooled with water so that the surface temperature of the wheel is controlled in order to prevent the copper in the sintered compact from being oxidized. At least 70% area of the finished surface by this method consists of flat diamond surface. Since coating of a metal film with sufficient adhesion strength cannot be achieved by the ordinary electroplating on such a surface as diamond grains are exposed on the most part thereof, a metal of the first layer is preferably coated by a sputtering method. The layers of second and the following can be coated by any methods of plating, sputtering or ion plating.

When the surface is finished by the above described wet grinding method, at least 70% area of the finished surface is covered with copper because the grinding wheel pull out the diamond grains and spread out the copper in the sintered compact during the machining. If the most part of the surface consists of copper as such, it is possible to coat a metal film with sufficient adhesion strength by an ordinary electroplating.

As illustrated above, the method for machining a surface of a sintered compact material can be classified into two methods, i.e. a method of exposing diamond grains at least 70% area of the finished surface (dry polishing) and a method of making at least 70% area of the finished surface is covered with copper (wet grinding). In either case the sintered compact work as a heat sink by coating metal layers on the finished surface with an appropriate method for each case (sputtering or electroplating).

In summary, the sintered compact of the invention is obtained by sintering at a high pressure and high temperature, and this sintered compact can achieve a higher thermal conductivity, which the sintered diamond compacts of the prior arts have not been able to achieve, by preventing oxidation of the copper binder. In the case of sintering at ambient pressure, the thermal conductivity cannot be raised because of the pores in the sintered compact. When a heat sink product for mounting a semiconductor chip is prepared using the sintered compact material of the present invention, the sintered compact is machined to a required shape and size followed by being coated with metal layer. The state of the finished surface differs depending on the surface finishing method, so it is required that the coating method of the first layer has to be changed.

The present invention will be illustrated in detail by the following example but the subject invention is not to be limited to the illustrated embodiment.

EXAMPLE 1

A commercially available diamond powder having a required grain diameter as shown in Table 1 and a copper powder having a grain diameter of at most 15 μm and a purity of 99.9% is mixed with a mixing ratio of Table 1, the mixed powders were charged in a container made of molybdenum, having such a construction as shown in FIG. 6, and an inner diameter of 25 mm and a depth of 5 mm with a niobium plate and titanium plate and compressed at a load of 2 t/cm² to obtain a compressed powder body. The container charged with this compressed body was covered with a molybdenum lid through a brazing material and heated in vacuum to braze and seal the container and lid. As comparative examples, there are shown in Table 1, as Comparative Examples 1 to 16, in which diamond grains having grain diameter of less than 5 μm were charged in the same capsule, or diamond grains having grain diameter of 5 to 100 μm were charged without vacuum sealing or without titanium plate and were prepared in the similar step and the like.

These containers were charged in an ultra-high pressure producing apparatus belt type, maintained at a pressure of 5 GPa and a temperature of 1100° C. for 5 minutes, the temperature was then lowered to 500° C., during which the system was maintained for 30 minutes and at the same time, the pressure was gradually lowered to the ambient pressure. The upper and lower part of the molybdenum container was subjected to grinding by a surface grinder to obtain a shaped body, which was then worked in a length of 10 mm, width of 4 mm and thickness of 1 mm and subjected to measurement of the thermal conductivity by a method comprising providing a temperature gradient at both the ends of a sample and obtaining a thermal conductivity from the temperature gradient (called constant method). The same sample was subjected to measurement of the thermal expansion by heating from room temperature to 300° C. by the use of a thermal expansion meter of vertical type. The measurement results of the thermal conductivity, CTE and density for each diamond grain diameter are summarized in Table 1. In Table, the copper powder mixing ratio and copper content are all represented by volume % on the whole sintered compact basis. The density can theoretically be calculated from the mixing ratio of copper and diamond, as evident from Table 1.

TABLE 1

Diamond Grain Diameter · Content and Thermal Conductivity

| Sample No. | Diamond Grain Diameter (μm) | Copper Powder Mixing Ratio (vol %) | Thermal Conductivity (W/m · K) | Thermal Expansion Coefficient (×10⁻⁶/K) | Density (g/cm³) | Oxygen Content (wt %) |
|---|---|---|---|---|---|---|
| 1 | 75-95 | 10 | 1050 | 3.2 | 4.07 | 0.016 |
| 2 | 75-95 | 20 | 930 | 4.1 | 4.60 | 0.019 |
| 3 | 75-95 | 30 | 870 | 5.7 | 5.15 | 0.018 |
| 4 | 75-95 | 40 | 820 | 6.4 | 5.69 | 0.020 |
| 5 | 40-60 | 10 | 920 | 3.2 | 4.05 | 0.018 |
| 6 | 40-60 | 20 | 810 | 4.0 | 4.61 | 0.022 |
| 7 | 40-60 | 30 | 760 | 5.9 | 5.15 | 0.021 |
| 8 | 40-60 | 40 | 730 | 6.5 | 5.68 | 0.024 |
| 9 | 30-40 | 10 | 810 | 3.1 | 4.06 | 0.015 |
| 10 | 30-40 | 20 | 720 | 3.9 | 4.61 | 0.018 |
| 11 | 30-40 | 30 | 670 | 5.8 | 5.14 | 0.021 |
| 12 | 30-40 | 40 | 640 | 6.4 | 5.70 | 0.020 |
| 13 | 20-30 | 10 | 750 | 3.0 | 4.06 | 0.016 |
| 14 | 20-30 | 20 | 680 | 4.1 | 4.62 | 0.018 |
| 15 | 20-30 | 30 | 630 | 5.7 | 5.13 | 0.021 |
| 16 | 20-30 | 40 | 590 | 6.4 | 5.70 | 0.023 |
| 17 | 10-20 | 10 | 690 | 3.1 | 4.08 | 0.019 |
| 18 | 10-20 | 20 | 640 | 4.0 | 4.65 | 0.020 |
| 19 | 10-20 | 30 | 590 | 5.9 | 5.12 | 0.019 |
| 20 | 10-20 | 40 | 550 | 6.3 | 5.65 | 0.023 |
| 21 | 5-10 | 10 | 620 | 3.0 | 4.05 | 0.020 |
| 22 | 5-10 | 20 | 580 | 4.1 | 4.59 | 0.022 |
| 23 | 5-10 | 30 | 540 | 5.8 | 5.11 | 0.021 |
| 24 | 5-10 | 40 | 510 | 6.4 | 5.64 | 0.024 |

TABLE 1-continued

Diamond Grain Diameter · Content and Thermal Conductivity

| | Diamond Grain Diameter (µm) | Copper Powder Mixing Ratio (vol %) | Thermal Conductivity (W/m · K) | Thermal Expansion Coefficient (×10$^{-6}$/K) | Density (g/cm$^3$) | Oxygen Content (wt %) |
|---|---|---|---|---|---|---|
| Comparative Example | | | | | | |
| 1 | 1-2 | 10 | 290 | 3.2 | 4.12 | 0.023 |
| 2 | 75-95 | 20 | 490 | 4.0 | 4.61 | 0.062 |
| 3 | 75-95 | 30 | 480 | 5.5 | 5.13 | 0.065 |
| 4 | 40-60 | 10 | 485 | 3.4 | 4.10 | 0.052 |
| 5 | 40-60 | 20 | 470 | 4.1 | 4.61 | 0.051 |
| 6 | 40-60 | 30 | 450 | 5.7 | 5.15 | 0.048 |
| 7 | 30-40 | 20 | 470 | 3.9 | 4.62 | 0.049 |
| 8 | 30-40 | 30 | 420 | 5.8 | 5.10 | 0.052 |
| 9 | 30-40 | 40 | 390 | 6.2 | 5.69 | 0.055 |
| 10 | 20-30 | 10 | 480 | 3.0 | 4.09 | 0.035 |
| 11 | 20-30 | 20 | 480 | 3.9 | 4.60 | 0.028 |
| 12 | 20-30 | 40 | 450 | 6.2 | 5.70 | 0.031 |
| 13 | 10-20 | 20 | 440 | 3.9 | 4.64 | 0.033 |
| 14 | 10-20 | 30 | 380 | 5.7 | 5.10 | 0.040 |
| 15 | 5-10 | 20 | 390 | 4.1 | 4.59 | 0.042 |
| 16 | 5-10 | 30 | 370 | 5.6 | 5.12 | 0.036 |

EXAMPLE 2

A commercially available diamond powder having a required grain diameter as shown in Table 1 was charged in a container made of molybdenum, having an inner diameter of 25 mm and a depth of 5 mm and compressed at a load of 2 t/cm$^2$ to obtain a compressed powder body of 2 mm thick. An oxygen free copper plate having a diameter of 25 mm and thickness of 0.5 mm was arranged to be in contact with the compressed body, upon which a Zr foil having a diameter of 25 mm and thickness of 0.5 mm was arranged. The container charged as described above, was covered with a molybdenum lid through a brazing material and heated in vacuum to braze and seal the container and lid. As comparative examples, there are shown in Table 2, as Comparative Examples 17 to 18, in which diamond grains were charged without vacuum sealing or without zirconium plate and were prepared in the similar step and the like.

These containers were charged in an ultra-high pressure producing apparatus belt type, maintained at a pressure of 5 GPa and a temperature of 1100° C. for 5 minutes, the temperature was then lowered to 500° C., during which the system was maintained for 30 minutes and at the same time, the pressure was gradually lowered to the atmospheric pressure. The upper and lower part of the recovered molybdenum container was subjected to polishing by a surface grinder to obtain a shaped body, which was then worked in a length of 10 mm, width of 4 mm and thickness of 1 mm and subjected to measurement of the thermal conductivity by a method comprising providing a temperature gradient at both the ends of a sample and obtaining a thermal conductivity from the temperature gradient (called ordinary method). The same sample was subjected to measurement of the thermal expansion by heating from room temperature to 300° C. by the use of a thermal expansion meter of vertical type. The measurement results of the thermal conductivity, CTE and density for each diamond grain diameter are summarized in Table 2. At the same time, the weight % of copper was analyzed by an emission spectrochemical analysis method and converted into the volume content, as shown in Table 2.

TABLE 2

| Sample No. | Diamond Grain Diameter (µm) | Thermal Conductivity (W/m · K) | Thermal Expansion Coefficient (×10$^{-6}$/K) | Copper Content (vol %) |
|---|---|---|---|---|
| 25 | 75-95 | 1100 | 3.7 | 15 |
| 26 | 40-60 | 890 | 3.9 | 18 |
| 27 | 30-40 | 730 | 4.0 | 20 |
| 28 | 20-30 | 650 | 4.1 | 21 |
| 29 | 10-20 | 600 | 4.3 | 22 |
| 30 | 5-10 | 570 | 4.5 | 23 |
| Comparative Example 17 | 30-40 | 450 | 4.1 | 21 |
| Comparative Example 18 | 5-10 | 380 | 4.6 | 23 |

EXAMPLE 3

The sintered compact prepared in Example 1 was worked so as to give a thickness of 0.5 mm by discharge working and then subjected to lapping at both the surface and back surface by the use of a diamond wheel of # 400. The thus lapped sintered compact was cut in a dimension of 3 mm×1 mm using a YAG laser having an output of 3 W. After the cutting work, breakages at the cutting edge and the surface roughnes of the lapped surface were measured to obtain results shown in Table 3. Similarly, a sample with a diamond grain diameter of 110 µm (Comparative Example 14) and another sample with a diamond grain diameter of 130 µm (Comparative Example 15), as comparative examples, were sintered in an analogous manner to Example 1 and then subjected to a working test, thus obtaining results shown in the same table.

TABLE 3

| Sample No. | Surface Roughness (Ra: μm) | Maximum Breakage Quantity at End (μm) |
|---|---|---|
| 1 | 0.08 | 8 |
| 2 | 0.07 | 8 |
| 3 | 0.07 | 6 |
| 4 | 0.06 | 5 |
| 5 | 0.05 | 4 |
| 6 | 0.05 | 3 |
| 7 | 0.03 | 2 |
| 8 | 0.01 | 2 |
| Comparative Example 14 | 0.12 | 10 |
| Comparative Example 15 | 0.15 | 12 |

EXAMPLE 4

The sintered compact No. 11 prepared in Example 1 was worked so as to give a thickness of about 0.5 mm by discharge working and then subjected to grinding at both the upper surface and lower surface to prepare a flat disk having a diameter of 50 mm and a thickness of 0.35 mm. A diamond wheel was fitted to a polishing device comprising a means for injecting a coolant to the back side of the wheel to control the wheel temperature to at most 40° C. and the flat disk of the composite sintered compact obtained in this way was polished on both the surfaces. After polishing for 20 hours, the compact was finished in a surface roughness Ra 0.08 μm, flatness of 50 μm/50 mm and thickness of 0.3 mm.

The above described sintered compact disk was cut in a dimension of 10.0×2.0×0.3 mm using a YAG laser. The resulting rectangular parallelepiped exhibited a maximum breakage of 7 μm on its ridgeline and a flatness of 5 μm/10 mm. The diamond-copper composite sintered composite worked in the rectangular parallelepiped was heated in a hydrogen atmosphere at 800° C. for 3 hours to remove copper oxide existing on the surface thereof. Using a magnetron sputtering apparatus, this sintered compact was subjected to multicoating of Ni 1 μm, Pt 0.5 μm and Au 0.1 μm. Furthermore, a solder of Au—Sn alloy was coated with a thickness of 3 μm using an evaporation apparatus to obtain a heat sink for mounting a semiconductor chip.

On the resulting heat sink for mounting a semiconductor chip was mounted a semiconductor laser to measure an optical output. For comparison, another heat sink having the same dimension but of another quality was subjected to measurement of an optical output, thus obtaining results as shown in Table 4.

TABLE 4

| Heat Sink Material | Thermal Conductivity (W/m · K) | Thermal Expansion Coefficient (×10⁻⁶/K) | Maximum Photo-Output (W) | Number of Breakages at Soldering Elements |
|---|---|---|---|---|
| CVD Diamond | 1000 | 2.3 | 80 | 15/20 |
| Example 1 - No. 11 | 760 | 5.3 | 130 | 0/20 |
| AlN | 200 | 4.5 | 70 | 0/20 |
| CuW | 180 | 6.5 | 100 | 0/20 |
| Cu | 400 | 17.0 | 120 | 7/20 |

Since CVD diamond and AlN are insulating materials, only their multilayer coatings form leading sites, which cause heat generation in the coated film and rising of the temperature of the semiconductor laser element. Thus, according to this combination, a high photo-output cannot be obtained.

EXAMPLE 5

The sintered compact No. 27 prepared in Example 2 was worked so as to give a thickness of about 0.4 mm by discharge working and then subjected to grinding at both the upper surface and lower surface to prepare a flat disk having a diameter of 50 mm and a thickness of 0.3 mm, which exhibited a surface roughness of Ra 0.08 μm after polishing.

The above described disk was cut under conditions of a voltage of 110 V, discharge time of 0.15 second and wire tension of 1200 g, after which the disk was subjected to finishing of the cut cross section under discharge conditions of a voltage of 4 V, discharge time of 0.05 second and wire tension of 1200 g, to obtain a rectangular parallelepiped having a dimension of 1.0×2.0×0.3 mm. The resulting rectangular parallelepiped exhibited a maximum breakage of 8 μm on its ridgeline. The diamond-copper composite sintered composite worked in rectangular parallelepiped was heated in a hydrogen atmosphere at 800° C. for 2 hours to remove copper oxide present on the surface thereof. The whole surface of this sintered compact was Ni-plated with a thickness of 1 μm and using a magnetron sputtering apparatus, the whole surface thereof was similarly coated with Pt with a thickness of 0.2 μm. Furthermore, a solder of Au—Sn alloy was coated on the surface to be mounted with a semiconductor chip with a thickness of 3 μm using an evaporation apparatus to obtain a heat sink for mounting a semiconductor chip.

On the resulting heat sink for mounting a semiconductor chip was mounted a semiconductor laser element in such a manner that a model of the cross section is shown in FIG. 7 to measure a photo-output from the semiconductor laser. For comparison, another heat sink having the same dimension but of another quality was subjected to measurement of a photo-output, thus obtaining results as shown in Table 5.

TABLE 5

| Heat Sink Material | Thermal Conductivity (W/m · K) | Thermal Expansion Coefficient (×10⁻⁶/K) | Maximum Photo-Output (W) | Number of Breakages at Solderin Elements |
|---|---|---|---|---|
| Diamond Single Crystal | 2000 | 2.3 | 370 | 13/20 |
| CVD Diamond | 1000 | 2.3 | 340 | 13/20 |
| Example 2 - No. 27 | 950 | 4.3 | 340 | 0/20 |
| Polycrystalline SiC | 250 | 4.2 | 310 | 0/20 |
| AlN | 200 | 4.5 | 300 | 0/20 |
| CuW | 180 | 6.5 | 300 | 0/20 |

Material of Semiconductor Laser: InP
Thermal Expansion Coefficient: 4.5 × 10⁻⁶/K
Charged Electric Current: 1.5 A
Applied Voltage: 2 V Utility Possibility on Commercial Scale According to the high thermal conductivity diamond sintered compact of the present invention, there can be provided a heat sink having a high thermal conductivity as well as matching of thermal expansions, most suitable for mounting a large sized and high thermal load semiconductor chip, for example, high output semiconductor lasers, high performance MPU, etc. Furthermore, the properties such as thermal conductivity and thermal expansion can freely be controlled, so it is possible to select the most suitable heat sink depending upon the features and designs of elements to be mounted.

What we claim is:

1. A high thermal conductivity diamond sintered compact comprising 60 vol. % to 80 vol. % of diamond grains on the whole sintered compact basis and the balance of substantially copper, which is substantially free from pores inside and has a diamond grain size distribution peak in a range of from 5 μm to 100 μm, at least two of the diamond grains constructing the sintered compact being directly bonded with each other, the copper forming the sintered compact substantially not being oxidized and the quantity of oxygen in the sintered compact being at most 0.025 weight %.

2. The high thermal conductivity diamond sintered compact as claimed in claim 1, wherein the coefficient of thermal expansion from room temperature to 300° C. is 3.0 to 6.5× $10^{-6}$/K.

3. The high thermal conductivity diamond sintered compact as claimed in claim 1 or 2, wherein the density of the sintered compact is from 4.05 g/cm$^3$ to 5.7 g/cm$^3$.

4. The high thermal conductivity diamond sintered compact as claimed in claim 1 or 2, wherein the volume fraction of the diamond grains contained in the sintered compact is 70 vol. % to 80 vol. %, on the whole sintered basis.

5. The high thermal conductivity diamond sintered as claimed in claim 1, wherein the coefficient of thermal expansion from room temperature to 300° C. is 3.9 to 6.1×$10^{-6}$/K.

6. The high thermal conductivity diamond sintered compact as claimed in claim 1, wherein the density of the sintered compact is from 4.55 g/cm$^3$ to 5.15 g/cm$^3$.

7. The high thermal conductivity diamond sintered compact as claimed in claim 1, wherein at least 70% area of the finished surface of the sintered compact consists of flat diamond grains and the balance of the area of copper.

8. The high thermal conductivity diamond sintered compact as claimed in claim 1, wherein at least 70% area of the finished surface of the sintered compact consists of copper and the balance of the area of diamond.

9. A diamond heat sink for mounting a semiconductor chip, in which the surface finished sintered compact according to claim 1, is used as a substrate and at least one pair of two opposite faces are coated with a metal film.

10. The diamond heat sink for mounting a semiconductor chip, as claimed in claim 9, wherein at least one pair of two opposite faces are coated with at least one metal selected from the group consisting of nickel, chromium, titanium and tantalum or their alloys, and the outermost layer of which is coated with one or more layers of at least one metal selected from the group consisting molybdenum, platinum, gold, silver, tin, lead, germanium and indium, or their alloy layers.

11. The diamond heat sink for mounting a semiconductor chip, as claimed in claim 9 or 10, wherein the face to be mounted with a semiconductor chip has a surface flatness of at most 30 μm/10 mm.

12. The diamond heat sink for mounting a semiconductor chip, as claimed in claim 9, wherein the face to be mounted with a semiconductor chip has a surface roughness of at most Ra 0.5 μm.

13. The diamond heat sink for mounting a semiconductor chip, as claimed in claim 9, wherein the chip out or the curvature radius of at least one edge of the surface to be mounted with a semiconductor chip is at most 30 μm.

14. A method for producing a high thermal conductivity diamond sintered compact comprising 60 vol. % to 90 vol. % of diamond grains on the whole sintered compact basis and the balance of substantially copper, which is substantially free from pores inside and has a diamond grain size distribution peak in a range of from 5 μm to 100 μm, at least two of the diamond grains constructing the sintered compact being directly bonded with each other, the copper forming the sintered compact substantially not being oxidized and the quantity of oxygen in the sintered compact being at most 0.025 weight %, the method comprising:

arranging a powder body of diamond grains having a grain size distribution of 5 μm to 100 μm in contact with an oxygen free copper sheet and one or more metal sheet selected from the Group IVa and Va metals in contact with the copper sheet in a metal capsule;

sealing the metal capsule in vacuum or in an inert gas or reducing gas;

applying pressure of 1 GPa to 6 GPa to the sealed metal capsule at a temperature of 1100° C. to 1500° C. to infiltrate the melted copper into the diamond powder body;

lowering the temperature to at most 900° C. to solidify the copper while maintaining the pressure at 1 GPa to 6 GPa; and lowering the pressure and temperature to ambient pressure and temperature to produce a sintered compact.

15. A method for producing a high thermal conductivity diamond sintered compact comprising 60 vol. % to 90 vol. % of diamond grains on the whole sintered compact basis and the balance of substantially copper, which is substantially free from pores inside and has a diamond grain size distribution peak in a range of from 5 μm to 100 μm, at least two of the diamond grains constructing the sintered compact being directly bonded with each other, the copper forming the sintered compact substantially not being oxidized and the quantity of oxygen in the sintered compact being at most 0.025 weight %, the method comprising:

mixing diamond powder having a grain size distribution in a range of from 5 μm to 100 μm and high purity copper powder with a purity of at least 99.9%;

arranging the mixed powder body in a metal capsule;

sealing the metal capsule in vacuum or in an inert gas or reducing gas;

applying pressure of 1 GPa to 6 GPa to the sealed metal capsule at a temperature of 1100° C. to 1500° C. to infiltrate the melted copper into the diamond powder body;

lowering the temperature to at most 900° C. to solidify the copper while maintaining the pressure at 1 GPa to 6 GPa; and lowering the pressure and temperature to ambient pressure and temperature to produce a sintered compact.

16. A method of producing a high thermal conductivity diamond sintered compact described in claim 7, in the process of surface finishing the sintered compact body into the required thickness and surface roughness wherein said surface finishing consists of a dry polishing of the sintered body using a polishing machine fitted with a resin bonded diamond wheel whose face temperature is controlled.

17. A method of producing a high thermal conductivity diamond sintered compact described in claim 8, in the process of surface finishing the sintered compact body into the required thickness and surface roughness wherein said surface finishing comprises a wet grinding of the sintered body using a surface grinder fitted with a resin bonded or vitrified bonded diamond grinding wheel.

18. A method of producing a diamond heat sink for mounting a semiconductor according to claim 9, in the process of coating a metal layers on the surface of the diamond-copper sintered compact, wherein said process comprises a process of being rinsed for the removal of the oxidized layer on the surface with weak acid and a process of coating with metal layers by any one of the methods of electroplating, electroless plating, sputtering, ion plating and vapor depositing individually or in combination.

19. A method of producing a diamond heat sink for mounting a semiconductor described in the claim 13, in the process of cutting the diamond-copper sintered compact to obtain a required shape and size, wherein said process comprises cutting with the use of the wire electric discharge machining or the laser cutting.

* * * * *